(12) United States Patent
Chang et al.

(10) Patent No.: US 7,271,048 B2
(45) Date of Patent: Sep. 18, 2007

(54) METHOD FOR MANUFACTURING TRENCH MOSFET

(75) Inventors: Chien-Ping Chang, Hsinchu (TW);
Mao Song Tseng, Hsinchu (TW); Hsin Huang Hsieh, Hsinchu (TW);
Tien-Min Yuan, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 11/202,733

(22) Filed: Aug. 12, 2005

(65) Prior Publication Data

US 2006/0046397 A1  Mar. 2, 2006

(30) Foreign Application Priority Data

Aug. 26, 2004  (TW)  ............... 93125615 A (51) Int. Cl.
*H01L 21/336* (2006.01)
(52) U.S. Cl. ............... 438/212; 438/270; 257/E29.282; 257/E21.375; 257/E21.41; 257/E21.629; 257/E21.643
(58) Field of Classification Search ................ 438/212, 438/270; 257/E29.262, E21.375, E21.41, 257/E21.629, E21.643
See application file for complete search history.

(56) References Cited

U.S. PATENT DOCUMENTS 5,385,852 A * 1/1995 Oppermann et al. ........ 438/270
5,576,245 A * 11/1996 Cogan et al. ............... 438/270
5,756,386 A * 5/1998 Blanchard ................... 438/270
5,844,273 A * 12/1998 Konishi ...................... 257/331
6,188,105 B1* 2/2001 Kocon et al. ............... 257/330
6,498,071 B2* 12/2002 Hijzen et al. ............... 438/425
6,566,230 B1* 5/2003 Sachar et al. ............... 438/435
6,638,826 B2* 10/2003 Zeng et al. ................. 438/270
6,686,625 B2* 2/2004 Tihanyi ...................... 257/331
6,919,249 B2* 7/2005 Kawano et al. ............. 438/270
6,989,306 B2* 1/2006 Chuang et al. ............. 438/270
2004/0191996 A1* 9/2004 Takaishi ..................... 438/270
2004/0253789 A1* 12/2004 Haase ......................... 438/270
2005/0266642 A1* 12/2005 Kubo et al. ................. 438/270
2006/0166403 A1* 7/2006 Ouellet et al. .............. 438/109

* cited by examiner

*Primary Examiner*—George Fourson
(74) *Attorney, Agent, or Firm*—Townsend and Townsend and Crew LLP (57) ABSTRACT

A method of manufacturing a trench MOSFET with high cell density is disclosed. The method introduces a sidewall oxide spacer for narrowing the opening of the trench structure, thereby decreasing the cell pitch of the memory units. Moreover, the source structure is formed automatically by means of an extra contact silicon etch for preventing the photoresist from lifting during the ion implantation of the prior art. On the other hand, the contact structure is filled with W-plug for overcoming the defect of poor metal step coverage resulted from filling the contact structure with AlSiCu according to the prior art. Thus, the cell density of the device can be increased; and the Rds-on and the power loss of the device can be decreased.

24 Claims, 7 Drawing Sheets

PRIOR ART

PRIOR ART

PRIOR ART

METHOD FOR MANUFACTURING TRENCH MOSFET

CROSS-REFERENCES TO RELATED APPLICATIONS

This application claims priority from R.O.C. patent application Ser. No. 093125615, filed Aug. 26, 2004, the entire disclosure of which is incorporated herein by reference.

BACKGROUND OF THE INVENTION

The present invention relates to a method of manufacturing a trench MOSFET, and more particularly to a method of manufacturing a trench MOSFET with high cell density.

Presently, products of power MOSFETs tend to have two features of low on-resistance (Rds-on) and high switch speed for improving the practical applications. The feature of low Rds-on is relative to the cell pitch and the cell density of the memory units in a device. Hence, the cell pitch of the memory units tends to decrease for increasing the cell density, thereby approaching the feature of low Rds-on. In order to decrease the cell pitch of the memory units, the designed pitch should be decreased. However the minimum pitch is limited due to the present producing equipments.

The traditional methods of manufacturing a trench MOSFET are disclosed in U.S. Pat. Nos. 5,567,634, 5,665,619, 5,904,525, 6,312,993, 6,368,920 and so on, which are incorporated herein by reference.

Figure 1A:
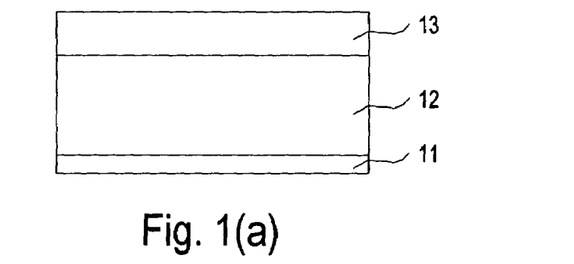
FIGS. 1(a)-1(k) illustrate a method of manufacturing a trench MOSFET according to the prior art.
Figure 1B:
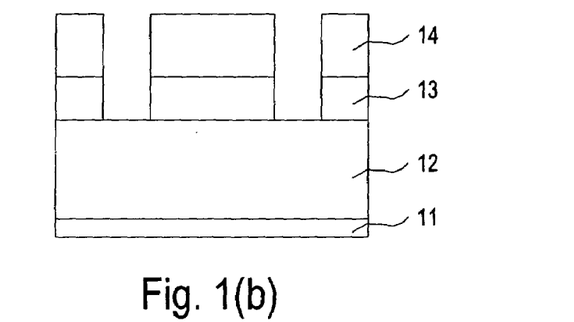
Figure 1C:
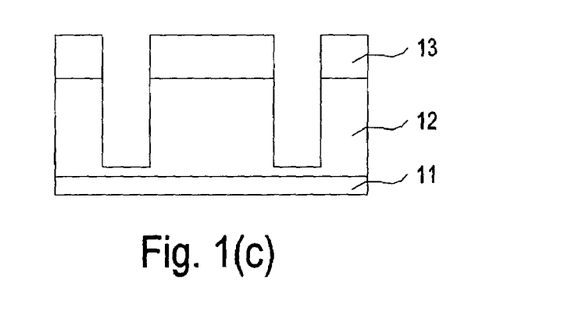
Figure 1D:
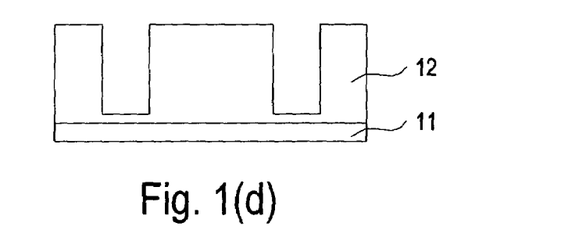
Figure 1E:
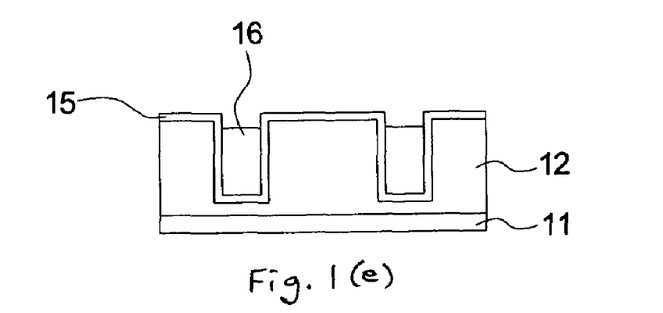
Figure 1F:
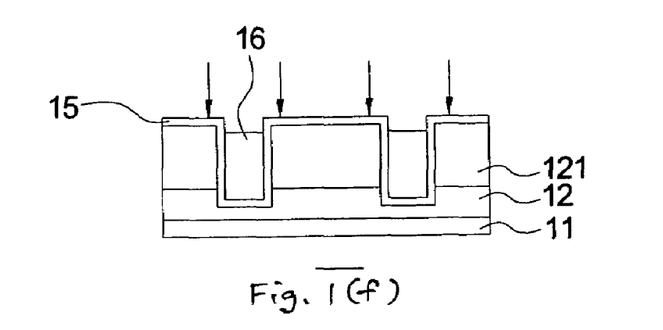
Figure 1G:
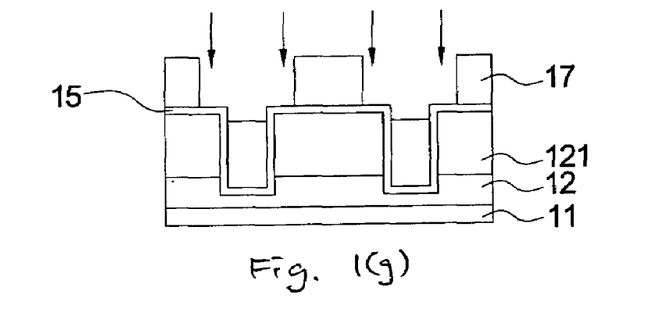
Figure 1H:
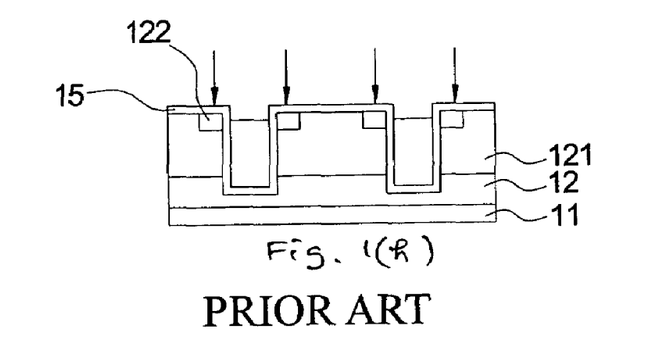

FIGS. 1(a)-1(k) schematically illustrate a traditional method of manufacturing a trench MOSFET. Firstly, an epitaxy layer 12 is formed on a substrate 11 and then a mask oxide layer 13 is formed on the epitaxy layer 12, as shown in FIG. 1(a). A photoresist 14 is formed on the mask oxide layer 13 and then a lithography and etching process is executed to define a trench opening on the mask oxide layer 13, as shown in FIG. 1(b). Subsequently, the photoresist 14 is removed and a dry etching process is executed to form a trench structure on the epitaxy layer 12, as shown in FIG. 1(c). Afterward, the mask oxide layer 13 is removed, as shown in FIG. 1(d). Further, a gate oxide layer 15 is formed on the surface of the epitaxy layer 12 and the inner sidewall of the trench structure, and then a polysilicon layer 16 is filled into the trench structure by deposition/lithography/etching process, as shown in FIG. 1(e). Then, a body implantation process is performed to form and drive in a body structure 121 in the epitaxy layer 12, as shown in FIG. 1(f). Subsequently, a photoresist 17 is formed on the above structure and defined by a lithography and etching process to form a source photoresist for a follow-up source structure, as shown in FIG. 1(g). Then a source implantation process is performed to form a source layer 122 in the body structure 121, and then the photoresist 17 is removed to complete a source structure drive-in, as shown in FIG. 1(h).

Figure 1I:
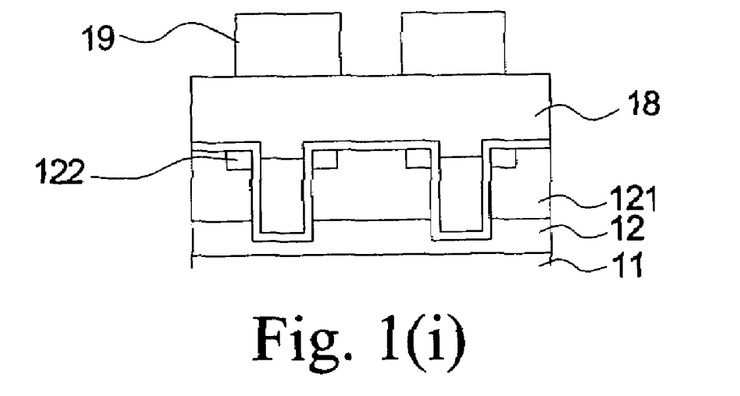
Figure 1J:
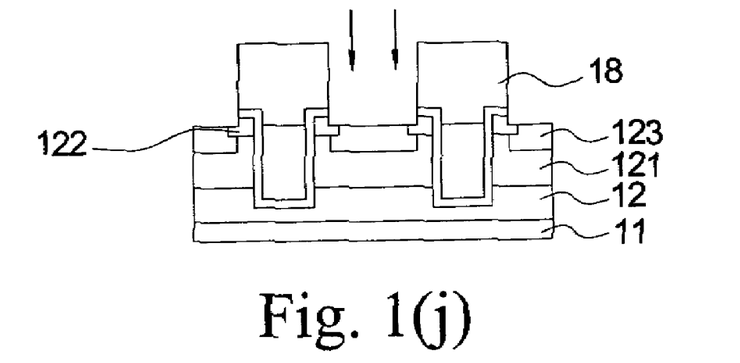
Figure 1K:
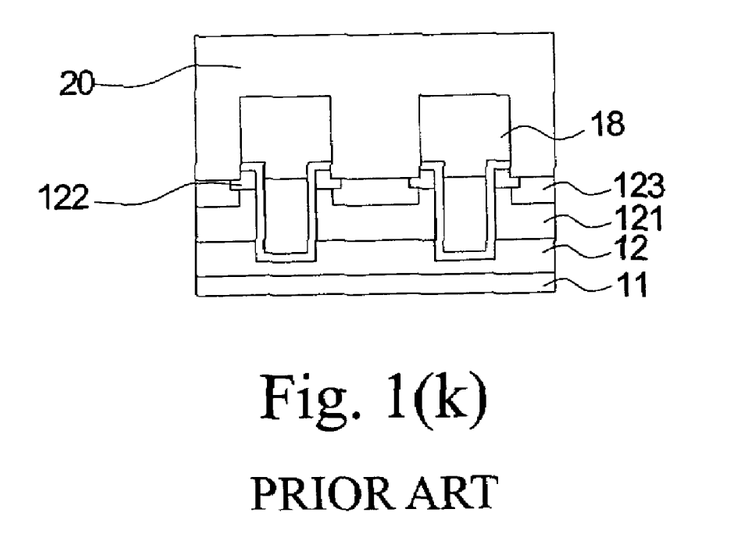

Afterward, a borophosphosilicate glass (BPSG) oxide layer 18 is deposited on the above structure and planarized to be a dielectric layer, and then a photoresist 19 for defining a contact region is formed on the BPSG oxide layer 18, as shown in FIG. 1(i). Subsequently, an etching process is performed to remove a portion of the BPSG oxide layer 18 for forming the contact region contacting with the source structure 122, and then a contact plus implantation process is performed to form the contact structure 123 in the body structure 121 after the photoresist 19 is removed, as shown in FIG. 1(j). Finally, a conductive metal layer 20 is sputtered on the above structure and then a lithography and etching process is performed to form the trench MOSFET, as shown in FIG. 1(k).

In the field of semiconductor manufacture technology, however, when a trench MOSFET or a shallow trench isolation (STI) structure is manufactured, the opening width of the trench is limited by the resolution of lithography process. Therefore the dimension of the entire device cannot be decreased as desired. Moreover, taking the above-described method for example, when the cell pitch of memory units is decreased, the introduced photoresist 17 may peel off during the ion implantation process (step (g) described above), which results a failure of the device. On the other hand, when the contact region is defined, the source structure 122 will be etched and removed partially, as shown in FIG. 1(j). Accordingly, when the contact region is filled with AlSiCu, it is easy to form poor metal step coverage between the conductive metal layer 20 and the source structure 122, thereby influencing the electrical performance of the entire device.

BRIEF SUMMARY OF THE INVENTION

Embodiments of the present invention provide a method of manufacturing a trench MOSFET without increasing the cost for rectifying those drawbacks and limitations of the prior art and solving the above problems.

It is a feature of the present invention to provide a method of manufacturing a trench MOSFET with high cell density, wherein the opening of the trench structure is decreased via introducing a sidewall oxide spacer formed by TEOS-LPCVD for decreasing the pitch of the memory units, increasing the cell density thereof, decreasing the Rds-on and further decreasing the power loss of the device.

In accordance with an aspect of the present invention, the method of manufacturing a trench MOSFET includes providing a substrate and forming an epitaxy layer on the substrate; forming a mask oxide layer on the epitaxy layer and defining a trench opening to expose a surface of the epitaxy layer where a trench structure is to be formed; forming a sidewall spacer on a sidewall of the mask oxide layer around the trench opening for narrowing the trench opening; etching the epitaxy layer to form a trench structure; removing the mask oxide layer and the sidewall spacer; forming a gate oxide layer on a surface of the epitaxy layer and an inner sidewall of the trench structure, and filling the trench structure with a polysilicon layer; implanting a body structure in the epitaxy layer; implanting a source layer between the body structure and the gate oxide layer; forming a dielectric layer on the trench structure and the gate oxide layer; downward etching the dielectric layer, the gate oxide layer and the source layer till a surface of the body structure for defining a source structure and forming a contact region; forming a contact plus structure in the body structure via the contact region, wherein the contact plus structure is exposed via the contact region; filling the contact region with a contact structure for contacting with the contact plus structure; and forming a conductive metal layer on the contact structure and the dielectric layer for obtaining the trench MOSFET.

It is another feature of the present invention to provide a method of manufacturing a trench MOSFET with high cell density, wherein the source structure is formed automatically by means of an extra contact silicon etch and the contact structure is filled with W-plug, thereby overcoming the defect of poor metal step coverage resulted from filling the contact structure with AlSiCu according to the prior art.

In accordance with another aspect of the present invention, the method of manufacturing a trench MOSFET includes providing a substrate; forming a first oxide layer on the substrate and defining a trench opening to expose a surface of the substrate where a trench structure is to be formed; forming a sidewall spacer on a sidewall of the first oxide layer around the trench opening for narrowing the trench opening; etching the substrate to form a trench structure; removing the first oxide layer and the sidewall spacer; forming a second oxide layer on a surface of the substrate and an inner sidewall of the trench structure, and filling the trench structure with a polysilicon layer; sequentially implanting a body structure and a source layer in the substrate, wherein the source layer is disposed between the body structure and the gate oxide layer; forming a dielectric layer on the trench structure and the second oxide layer; downward etching the dielectric layer, the second oxide layer and the source layer till a surface of the body structure for defining a source structure and forming a contact region; and forming a conductive metal layer on the contact structure and the dielectric layer for obtaining the trench MOSFET.

The present invention is not limited to the above embodiment. The above objects and advantages of the present invention will become more readily apparent to those ordinarily skilled in the art after reviewing the following detailed description and accompanying drawings, in which:

DETAILED DESCRIPTION OF THE INVENTION

The present invention discloses a method of manufacturing a trench MOSFET, and the objects and advantages of the present invention will become more readily apparent to those ordinarily skilled in the art after reviewing the following detailed description. The present invention is not limited to the following embodiment.

Figure 2A:
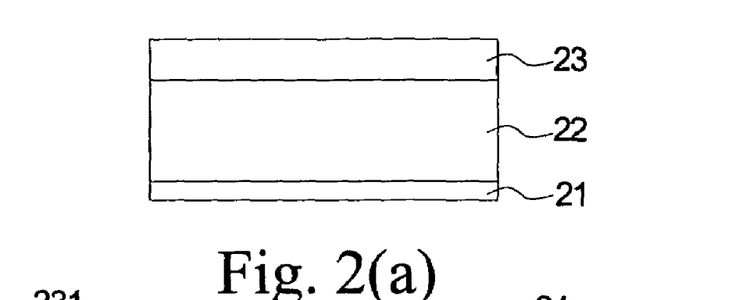
FIGS. 2(a)-2(l) illustrate a method of manufacturing a trench MOSFET according to an embodiment of the present invention.

FIGS. 2(a)-2(l) illustrate a method of manufacturing a trench MOSFET according to an embodiment of the present invention. The method of manufacturing a trench MOSFET with high cell density is described in the following embodiment. Firstly, an epitaxy layer 22 is formed on a silicon substrate 21 via a horizontal, a vertical, or a cylinder epitaxy reactor, wherein the epitaxy layer 22 can be a doped silicon epitaxy layer, such as an N-type or a P-type epitaxy layer. Certainly, the dopant concentration can be varied according to the requirement of the device. Afterward, a mask oxide layer 23 is formed on the epitaxy layer 22 by a deposition process. In this embodiment, the mask oxide layer is a tetra ethyl ortho silicate (TEOS) oxide layer formed on the epitaxy layer 22 by a TEOS-CVD process, and the resulted mask oxide layer has a thickness ranging from about 0.3 to 1 μm, as shown in FIG. 2(a).

Figure 2B:
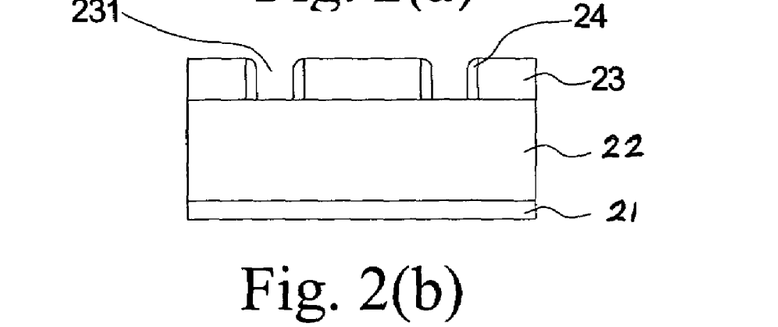

The mask oxide layer 23 is etched by a lithography and etching process for defining a trench opening 231 to expose a surface of the epitaxy layer 22 where a trench structure is to be formed. To narrow the trench opening 231, a sidewall spacer 24 is further formed on the sidewall of the mask oxide layer 23 around the trench opening 231 according to the present invention. The forming steps of the sidewall spacer 24 are described as follows. A spacer layer (not shown) is first deposited on the mask oxide layer 23 and the exposed epitaxy layer 22 with a thickness ranging from about 0.1 to 0.8 μm. Then an isotropic etching is executed to etch down the spacer layer, thereby forming the sidewall spacer 24 on the sidewall of the mask oxide layer 23 around the trench opening 231. In practice, the sidewall spacer 24 can be formed of oxide or silicon nitride, i.e., the deposited spacer layer can be a TEOS oxide layer or a silicon nitride layer, wherein the materials can be varied according to the requirement. The resulted structure is shown in FIG. 2(b).

Figure 2C:
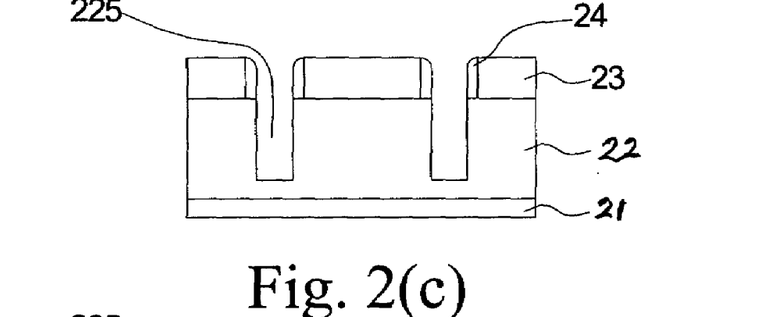
Figure 2D:
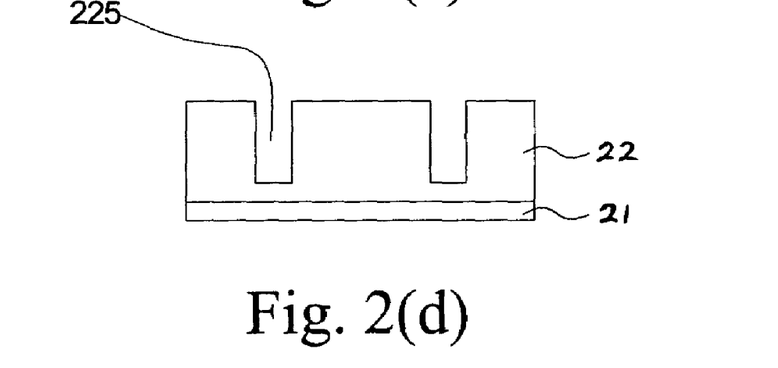

After the sidewall spacer 24 is formed, the epitaxy layer 22 can be etched using the mask oxide layer 23 and the sidewall spacer 24 as the mask through the narrowed opening 231 to form a trench structure 225, as shown in FIG. 2(c). Then the mask oxide layer 23 and the sidewall spacer 24 are removed, as shown in FIG. 2(d), and the follow-up steps of manufacturing the MOSFET can performed. As desired, the trench structure 225 formed according to the above steps of the present invention is narrower than that of the prior art.

Figure 2E:
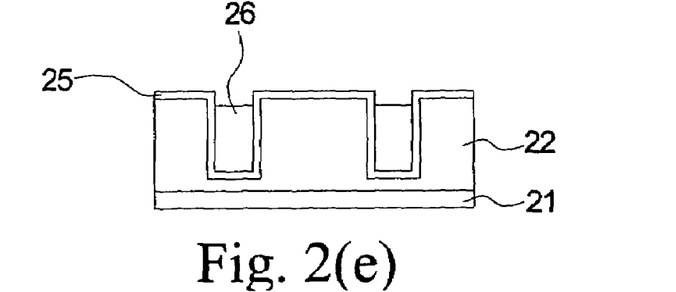

Following the above steps, a gate oxide layer 25 is formed on the surface of the epitaxy layer 22 and the inner sidewall of the trench structure 225, wherein the thickness of the gate oxide layer 25 can be adjusted according to the requirement. After the gate oxide layer 25 is formed, the trench structure 225 is filled with polysilicon by the deposition of a polysilicon layer (not shown) so as to form a polysilicon structure 26, wherein the redundant polysilicon layer is removed via an etching process, and the resulted structure is shown in FIG. 2(e).

Figure 2F:
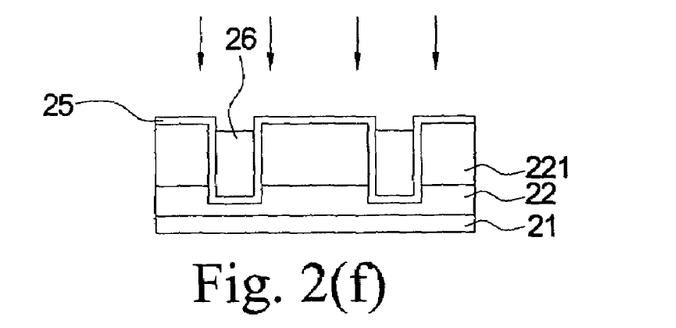
Figure 2G:
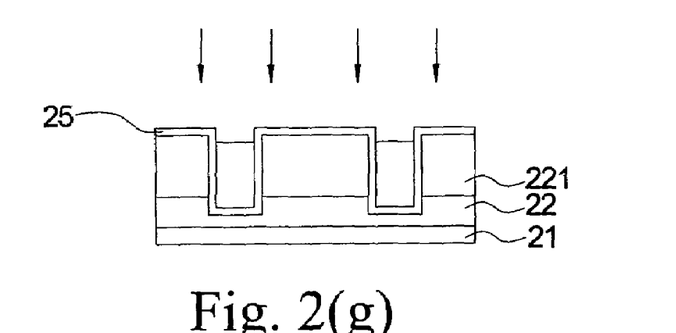
Figure 2H:
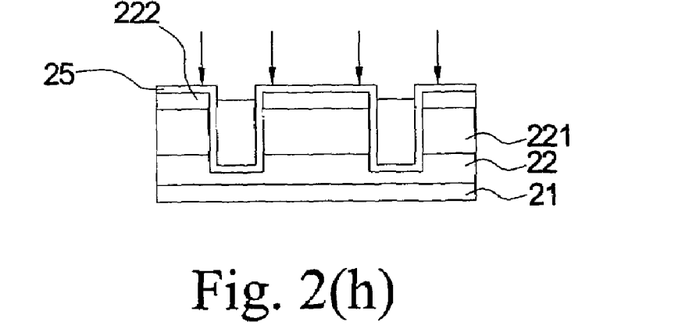

As shown in FIG. 2(f), a body implantation/drive-in is performed to form a body structure 221 in the epitaxy layer 22. Then a blanket implantation is executed to implant and drive in a source layer 222, such that the body implantation and the source implantation have the same implantation area. Certainly, the source implantation of the present invention can also be performed via a mask, and the source structure is driven in after removing the mask. The source layer 222 is formed between the body structure 221 and the gate oxide layer 25, and has a source junction depth ranging from about 0.2 to 1 μm, as shown in FIGS. 2(g) and 2(h).

Figure 2I:
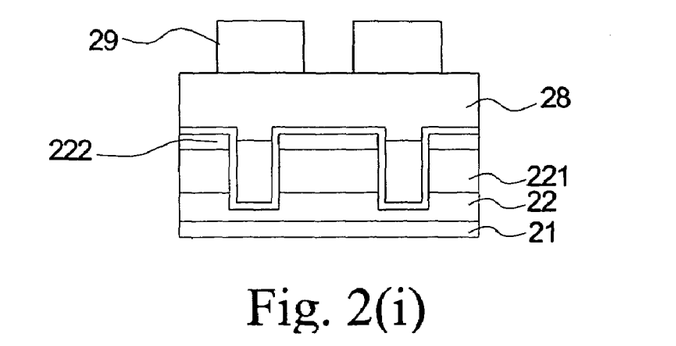
Figure 2J:
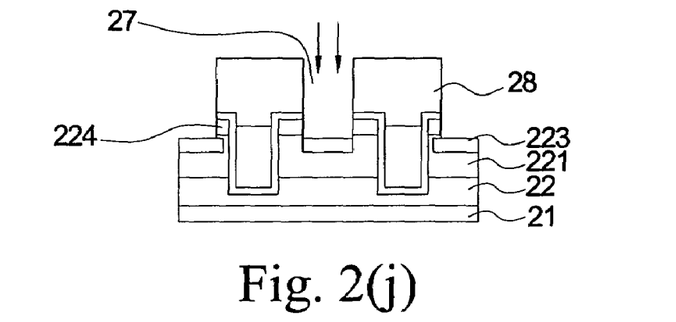

Subsequently, a borophosphosilicate glass (BPSG) dielectric layer 28 is deposited and planarized on the above structure. Furthermore, a photoresist 29 is formed to define a contact opening via a lithography process, as shown in FIG. 2(i). Then an etching process is executed through the contact opening of the photoresist 29 to etch down through the dielectric layer 28, the gate oxide layer 25, and the source layer 222 till the surface of the body structure 22 for defining a source structure 224 and forming a contact region 27, wherein the etching process is an extra contact silicon etch. The photoresist 29 is removed later. A contact plus implantation is executed via the contact region 27 for forming a contact plus structure 223 in the body structure 221, wherein the contact plus structure 223 is exposed via the contact region 27, as shown in FIG. 2(j).

Figure 2K:
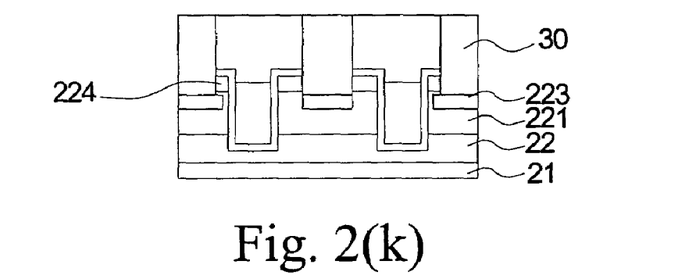
Figure 2L:
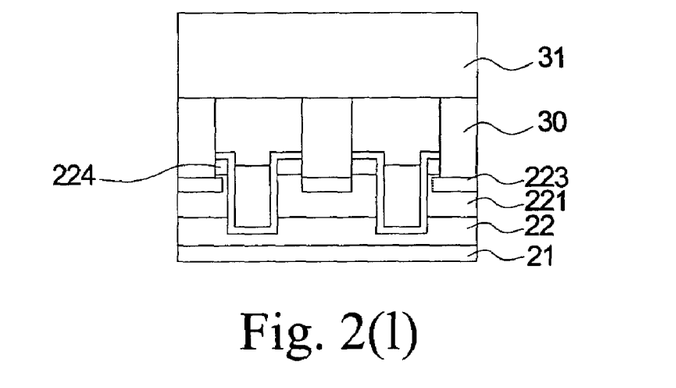

Finally, a contact layer (not shown) with a thickness ranging from about 0.2 to 0.8 μm is formed by a W-CVD process for well filling the contact region 27 with a W-plug 30 to contact with the contact plus structure 223. Meanwhile the redundant contact layer will be removed via an etching back process till the dielectric layer, and the resulted structure is shown in FIG. 2(k). An AlSiCu conductive metal layer 31 is deposited on the W-plug 30 and the dielectric layer 28. The trench MOSFET with high cell density is obtained after defining layouts on the conductive metal layer 31 by a lithography and etching process, as shown in FIG. 2(l).

Figure 3:
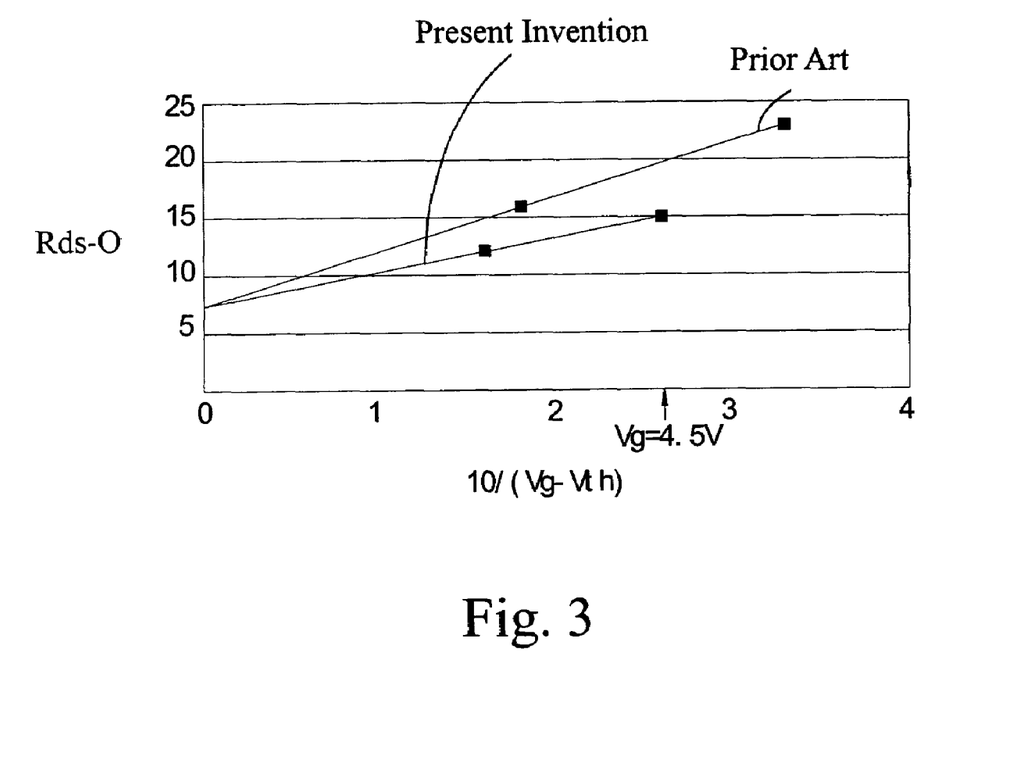
FIG. 3 illustrates a relative figure of on-resistance (Rds-on) and gate bias (Vg)-threshold voltage (Vth) according to the present invention and the prior art.

Compared with the prior products, the present invention provides 0.45-time cell pitch of memory units of the prior art. In a constant unit area, the present embodiment can fill it with 5 times the memory units of the prior art. Namely, the trench MOSFET of the present embodiment has 5 times the cell density of the prior art. Moreover, referring to FIG. 3, it illustrates a relative figure of on-resistance (Rds-on) and gate bias (Vg)-threshold voltage (Vth) of trench MOSFETs according to the present embodiment and the prior art. When the threshold voltage is about 4.5, the Rds-on of the present embodiment is decreased by 20% as compared to that of the prior art.

Therefore, the present invention provides a method of manufacturing a trench MOSFET with high cell density. The trench opening is narrowed by means of forming a sidewall oxide spacer, so as to further reduce the cell pitch of the memory units. On the other hand, the source structure of the present invention is formed automatically by means of an extra contact silicon etch, which prevents the photoresist from lifting during the ion implantation process of the prior art. Moreover, the contact structure is filled with a W-plug, which overcomes the defect of poor metal step coverage resulted from filling the contact structure with AlSiCu according to the prior art. Therefore, the cell density of the device can be increased, and the Rds-on and the power loss of the device can be decreased.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of manufacturing a trench MOSFET comprising:
    providing a substrate and forming an epitaxy layer on said substrate;
    forming a mask oxide layer on said epitaxy layer and defining a trench opening to expose a surface of said epitaxy layer where a trench structure is to be formed;
    forming a sidewall spacer on a sidewall of said mask oxide layer around said trench opening for narrowing said trench opening;
    etching said epitaxy layer to form a trench structure;
    removing said mask oxide layer and said sidewall spacer;
    forming a gate oxide layer on a surface of said epitaxy layer and an inner sidewall of said trench structure, and filling said trench structure with a polysilicon layer;
    after filling said trench structure with a polysilicon layer, implanting a body structure in said epitaxy layer;
    blanket implanting a source layer between said body structure and said gate oxide layer;
    forming a dielectric layer on said trench structure and said gate oxide layer;
    downward etching said dielectric layer, said gate oxide layer and said source layer till a surface of said body structure for defining a source structure and forming a contact region;
    forming a contact plus structure in said body structure via said contact region, wherein said contact plus structure is exposed via said contact region;
    filling said contact region with a contact layer for contacting with said contact plus structure;
    back etching said contact layer till a surface of said dielectric layer; and
    forming a conductive metal layer on said contact layer and said dielectric layer for obtaining said trench MOSFET.

2. The method according to claim 1, wherein said epitaxy layer is an N-type or a P-type epitaxy layer, and said mask oxide layer is a tetra ethyl ortho silicate (TEOS) layer formed by a TEOS-CVD process and with a thickness ranging from about 0.3 to 1 µm.

3. The method according to claim 1, wherein forming the sidewall spacer comprises:
    depositing a spacer layer on said mask oxide layer and said exposed epitaxy layer; and
    etching said spacer layer to form said sidewall spacer on said sidewall of said mask oxide layer around said trench opening.

4. The method according to claim 3, wherein said spacer layer is a TEOS oxide layer or a silicon nitride layer and has a thickness ranging from about 0.1 µm to 0.8 µm.

5. The method according to claim 1, wherein implanting the body structure and implanting the source layer have the same implantation area, and implanting the source layer is performed by a blanket implantation process.

6. The method according to claim 1, wherein said source layer has a source junction depth ranging from about 0.2 to 1 µm.

7. The method according to claim 1, wherein said dielectric layer is a borophosphosilicate glass (BPSG) layer.

8. The method according to claim 1, wherein forming the dielectric layer comprises planarizing said dielectric layer.

9. The method according to claim 1, wherein filling the contact region comprises:
    forming said contact layer with a thickness ranging from about 0.2 to 0.8 µm by a W-CVD process.

10. The method according to claim 1, wherein said conductive metal layer is an AlSiCu metal layer.

11. The method according to claim 1, wherein said downward etching of said dielectric layer is an extra etch to said epitaxy layer after etching said epitaxy layer to form said trench structure.

12. A method of manufacturing a trench MOSFET comprising:
    providing a substrate;
    forming a first oxide layer on said substrate and defining a trench opening to expose a surface of said substrate where a trench structure is to be formed;
    forming a sidewall spacer on a sidewall of said first oxide layer around said trench opening for narrowing said trench opening;
    etching said substrate to form a trench structure;
    removing said first oxide layer and said sidewall spacer;
    forming a second oxide layer on a surface of said substrate and an inner sidewall of said trench structure, and filling said trench structure with a polysilicon layer;
    after filling said trench structure with a polysilicon layer, sequentially implanting a body structure and a source layer in said substrate, wherein said source layer is disposed between said body structure and said gate oxide layer, and implanting the source layer is performed by a blanket implantation process;

forming a dielectric layer on said trench structure and said second oxide layer;

downward etching said dielectric layer, said second oxide layer and said source layer till a surface of said body structure for defining a source structure and forming a contact region;

forming a contact structure in said contact region;

back etching said contact structure till a surface of said dielectric layer; and forming a conductive metal layer on said contact structure and said dielectric layer for obtaining said trench MOSFET.

13. The method according to claim 12, wherein said substrate is an N-type or a P-type substrate, and said first oxide layer is a tetra ethyl ortho silicate (TEOS) layer formed by a TEOS-CVD process and with a thickness ranging from about 0.3 to 1 µm.

14. The method according to claim 12, wherein forming the sidewall spacer comprises:

depositing a spacer layer on said first oxide layer and said exposed substrate; and etching said spacer layer to form said sidewall spacer on said sidewall of said first oxide layer around said trench opening.

15. The method according to claim 14, wherein said spacer layer is a TEOS oxide layer or a silicon nitride layer and has a thickness ranging from about 0.1 µm to 0.8 µm.

16. The method according to claim 12, wherein said implanting is performed by a blanket implantation process.

17. The method according to claim 12, wherein said source layer has a source junction depth ranging from about 0.2 to 1 µm.

18. The method according to claim 12, wherein forming the dielectric layer comprises planarizing said dielectric layer.

19. The method according to claim 12, wherein forming the contact structure comprises:

forming a contact plus structure in said body structure via said contact region, wherein said contact plus structure is exposed via said contact region.

20. The method according to claim 12, wherein forming the contact structure comprises:

forming a contact layer with a thickness ranging from about 0.2 to 0.8 µm by a W-CVD process.

21. The method according to claim 12, wherein said conductive metal layer is an AlSiCu metal layer.

22. The method according to claim 12, wherein said downward etching is an extra etch to said substrate after etching said substrate to form said trench structure.

23. The method according to claim 1, wherein said contact layer comprises a W plug and wherein said conductive metal layer comprises an AlSiCu layer.

24. The method according to claim 12, wherein said contact structure comprises a W plug and wherein said conductive metal layer comprises an AlSiCu layer.

* * * * *